US012757492B2

(12) United States Patent
Zhao et al.

(10) Patent No.: US 12,757,492 B2
(45) Date of Patent: Oct. 6, 2026

(54) DISPLAY PANELS AND MANUFACTURING METHODS THEREOF

(71) Applicant: GUANGZHOU CHINA STAR OPTOELECTRONICS SEMICONDUCTOR DISPLAY TECHNOLOGY CO., LTD., Guangzhou (CN)

(72) Inventors: Bin Zhao, Guangzhou (CN); Juncheng Xiao, Guangzhou (CN); Shan Li, Guangzhou (CN); Hang Wang, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 265 days.

(21) Appl. No.: 18/396,088

(22) Filed: Dec. 26, 2023

(65) Prior Publication Data

US 2025/0176263 A1 May 29, 2025

(30) Foreign Application Priority Data

Nov. 28, 2023 (CN) ......................... 202311621711.6

(51) Int. Cl.
*H10D 86/60* (2025.01)
*H10D 86/01* (2026.01)
*H10D 86/40* (2025.01)

(52) U.S. Cl.
CPC ......... *H10D 86/60* (2025.01); *H10D 86/0221* (2025.01); *H10D 86/0231* (2025.01); *H10D 86/423* (2025.01); *H10D 86/441* (2025.01)

(58) Field of Classification Search
CPC ............... H10D 86/60; H10D 86/0221; H10D 86/0231; H10D 86/423; H10D 86/441
See application file for complete search history.

(56) References Cited

U.S. PATENT DOCUMENTS

2013/0056724 A1* 3/2013 Chae .................... H10D 86/021 438/23

FOREIGN PATENT DOCUMENTS

CN 106653774 A 5/2017
CN 114784023 A 7/2022
CN 115700922 A 2/2023
(Continued)

OTHER PUBLICATIONS

Chinese Office Action issued in corresponding Chinese Patent Application No. 202311621711.6 dated May 20, 2026, pp. 1-7, 15pp.

*Primary Examiner* — Jay C Kim
*Assistant Examiner* — Woo K Lee
(74) *Attorney, Agent, or Firm* — The Roy Gross Law Firm, LLC; Roy D. Gross

(57) ABSTRACT

A display panel and a manufacturing method thereof are provided by the present disclosure. The display panel includes a substrate, a first device layer, a second device layer and a third device layer stacked sequentially. The first device layer includes a gate. The second device layer includes an active part and a pixel electrode disposed on a side of the gate away from a substrate. The third device layer includes a source disposed on a side of the active part away from the gate. The source is connected to the active part.

20 Claims, 13 Drawing Sheets

(56) References Cited

FOREIGN PATENT DOCUMENTS

| | | | | | |
|---|---|---|---|---|---|
| CN | 116018552 | A | | 4/2023 | |
| CN | 116184730 | A | | 5/2023 | |
| JP | H10104595 | A | | 4/1998 | |
| JP | 2014010413 | A | | 1/2014 | |
| KR | 20140113157 | A | * | 9/2014 | ........... H10K 71/621 |

* cited by examiner

DISPLAY PANELS AND MANUFACTURING METHODS THEREOF

CROSS-REFERENCE TO RELATED APPLICATION

This application claims priority to and the benefit of Chinese Patent Application No. 202311621711.6, filed on Nov. 28, 2023, the disclosure of which is incorporated herein by reference in its entirety.

TECHNICAL FIELD

The present disclosure relates to display technologies, and in particular to display panels and manufacturing method of the display panels.

BACKGROUND

Oxide semiconductors have high mobility and can replace amorphous silicon (a-Si) for preparing high-performance (such as high refresh rate and high resolution) liquid crystal display (LCD) panels. Moreover, the oxide semiconductors have significant cost advantages compared to low temperature polysilicon (LTPS), and therefore the oxide semiconductors are widely used in the display panels.

However, a preparation of an oxide backplate requires more masks, especially in high transmission fringe field switching (HFS) display modes, the oxide backplate generally requires at least 6 mask processes, making the process complex and production costs high.

SUMMARY

The embodiments of the present disclosure provide a display panel. The display panel includes a substrate, a first device layer, a second device layer, and a third device layer. The first device layer is disposed on the substrate and includes a gate. The second device layer is disposed on a side of the first device layer away from the substrate. The second device layer includes an active part and a pixel electrode. The active part and the pixel electrode are disposed on a side of the gate away from the substrate. A third device layer is disposed on a side of the second device layer away from the first device layer. The third device layer includes a source disposed on a side of the active part away from the gate. The source is connected to the active part. The display panel further includes a drain. The drain is electrically connected to the pixel electrode and the active part.

The embodiments of the present disclosure further provide a manufacturing method of the display panel, including the following steps.

A substrate is provided.

A first device layer is formed on the substrate. The first device layer includes a gate.

A second device layer is formed on a side of the first device layer away from the substrate, and a third device layer is formed on a side of the second device layer away from the first device layer. The second device layer includes an active part and a pixel electrode disposed on a side of the gate away from the substrate. The third device layer includes a source disposed on a side of the active part away from the gate, and the source is connected to the active part.

The manufacturing method further includes: forming a drain. The drain is electrically connected to the pixel electrode and the active part.

BRIEF DESCRIPTION OF THE DRAWINGS

Based on the accompanying drawings, a detailed description of the specific implementation of the present disclosure will make the technical solution and other beneficial effects of the present disclosure obvious.

DETAILED DESCRIPTION

Figure 1:
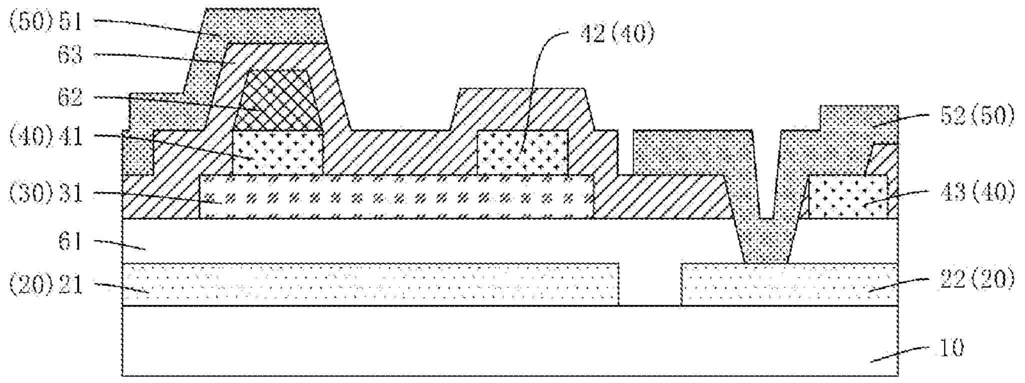
FIG. 1 is a first cross-sectional schematic view of a display panel corresponding to an active part provided by an embodiment of the present disclosure.

The technical solutions in the embodiments of the present disclosure will be described clearly and completely hereafter with reference to the accompanying drawings. Apparently, the described embodiments are only a part of but not all embodiments of the present disclosure. All other embodiments obtained by those skilled in the art based on the embodiments of the present disclosure without creative efforts shall fall within the protection scope of the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Figure 2:
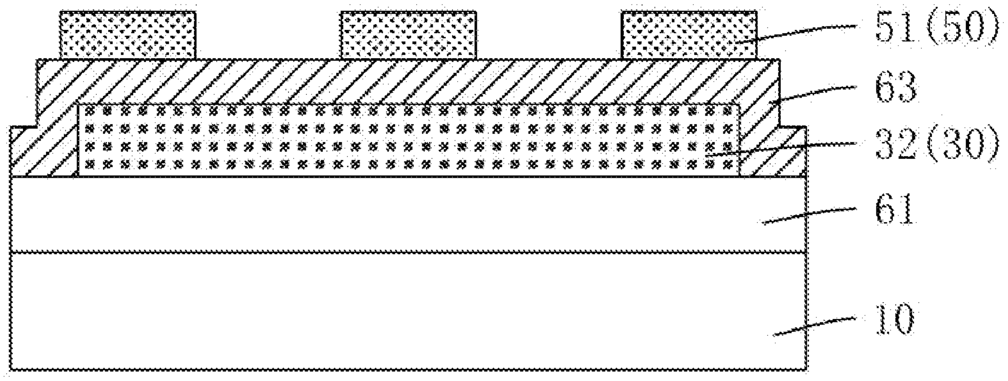
FIG. 2 is a cross-sectional schematic view of the display panel corresponding to a pixel electrode provided by an embodiment of the present disclosure.
Figure 3:
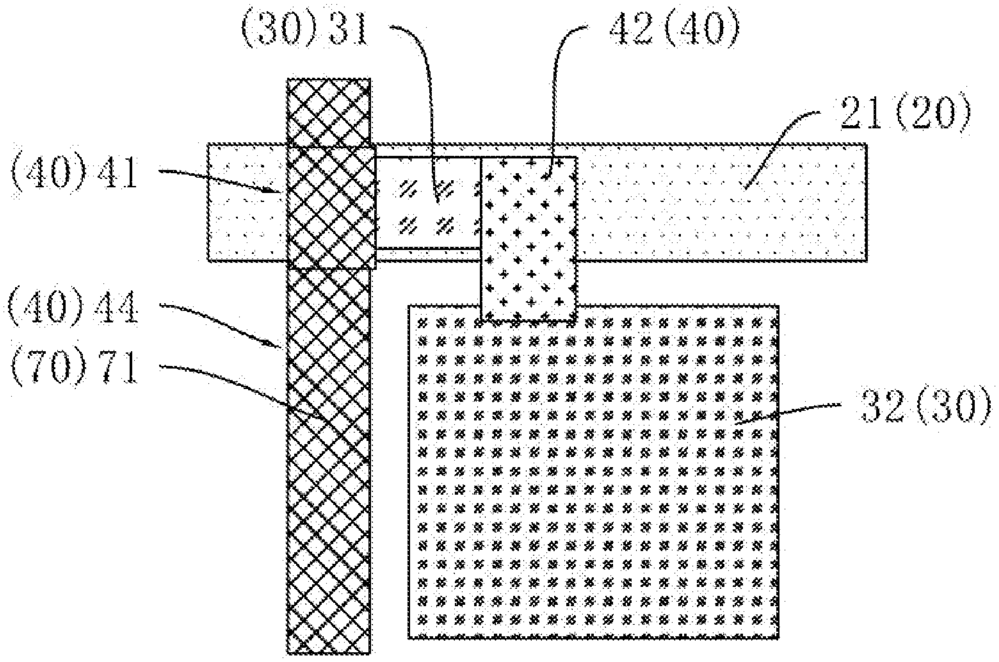
FIG. 3 is a planar schematic view of the display panel provided by an embodiment of the present disclosure.

Referring to FIGS. 1, 2 and 3, an embodiment of the present disclosure provides a display panel. The display panel includes a substrate 10, a first device layer 20, a second device layer 30, and a third device layer 40.

The first device layer 20 is disposed on the substrate 10. The first device layer 20 includes a gate 21. The second device layer 30 is disposed on a side of the first device layer 20 away from the substrate 10. The second device layer 30 includes an active part 31 and a pixel electrode 32 disposed on a side of the gate 21 away from the substrate 10. The third device layer 40 is disposed on a side of the second device layer 30 away from the first device layer 20. The third device layer 40 includes a source 41 disposed on a side of the active part 31 away from the gate 21. The source 41 is connected to the active part 31.

Furthermore, the display panel further includes a drain 42. The drain is electrically connected to the pixel electrode 32 and the active part 31.

In the implementation and application process, the pixel electrodes 32 and the active parts 31 are formed in a same film layer in the embodiments of the present disclosure, which may reduce the number of photomasks and simplify the process, and thereby reducing production costs.

Continuing to refer to FIGS. 1, 2, and 3, the display panel provided by an embodiment of the present disclosure includes the substrate 10 and an array layer disposed on the substrate 10. The array layer includes a thin film transistor 10 and a plurality of electrodes disposed on the substrate.

Specifically, the array layer includes the first device layer 20, a gate insulation layer 61, the second device layer 30, the third device layer 40, an organic insulation layer 62, an inorganic insulation layer 63, and a fourth device layer. The gate insulation layer 61 is disposed on the side of the first device layer 20 away from the substrate 10 and covers the first device layer 20. The second device layer 30 is disposed on a side of the gate insulation layer 61 away from the first device layer 20. The third device layer 40 is disposed on the side of the second device layer 30 away from the gate insulation layer 61. The organic insulation layer 62 is disposed on a side of the third device layer 40 away from the second device layer 30. The inorganic insulation layer 63 is disposed on a side of both the organic insulation layer 62 and the third device layer 40 away from the substrate 10. The fourth device layer 50 is disposed on a side of the inorganic insulation layer 63 away from the organic insulation layer 62.

The first device layer 20 includes a gate 21 and a first signal line 22 disposed on the substrate 10. The gate 21 is used to form a thin film transistor, and the first signal line 22 may be used to transmit signals to the thin film transistor.

The gate insulation layer 61 covers the gate 21 and the first signal line 22.

The second device layer 30 includes an active part 31. The active part 31 is disposed on a side of the gate 21 away from the substrate 10. The third device layer 40 includes a source 41 and a drain 42, a data line 44, and a second signal line 43. The source 41 and the drain 42 are disposed on a side of the active part 31 away from the gate 21, and connected to opposite ends of the active part 31. The data line 44 is connected to the source 41. The organic insulation layer 62 covers a surface of the source 41 away from the substrate 10, and a surface of the data line 44 away from the substrate 10. The inorganic insulation layer 63 covers the active part 31, the organic insulation layer 62, and the drain 42. The gate 21, the active part 31, the source 41, and the drain 42 form the thin film transistor.

The fourth device layer 50 includes a common electrode 51 and an adapter part 52. The common electrode 51 and the adapter part 52 are disposed on a side of the inorganic insulation layer 63 away from the substrate 10. One end of the adapter part 52 is connected to a second signal line 43, and other end of the adapter part 52 passes through the inorganic insulation layer 63 and the gate insulation layer 61 and is connected to the first signal line 22. The display panel includes a display area, a non-display area adjacent to the display area, and a driving circuit unit disposed in the non-display area. One end of the second signal line 43 is connected to the driving circuit unit, and other end of the second signal line 43 is connected to the adapter part 52.

Materials of the first device layer 20 and the third device layer 40 may both be transparent conductive materials. A material of the fourth device layer 50 may be a transparent conductive material, such as indium tin oxide.

In an embodiment, the driving circuit unit is a gate driver on array (GOA) gate driving circuit unit. The second signal line 43 may be used to transmit a scanning signal from the GOA gate driving circuit unit to the display area and transmit the scanning signal to the gate 21 through the first signal line 22.

In the embodiment of the present disclosure, the second device layer 30 further includes a pixel electrode 32, that is, the active part 31 and the pixel electrode 32 belong to a same film layer. However, the active part 31 is a semiconductor, and the pixel electrode 32 is a conductor. For example, a semiconductor material may be used to prepare the second device layer 30, and an area corresponding to the pixel electrode 32 may be performed a conductive treatment to maintain the semiconductor characteristics of the active part 31 and maintain the conductor characteristics of the pixel electrode 32 to achieve conductivity function. One end of the drain 42 is connected to the active part 31, and other end of the drain 42 is connected to the pixel electrode 32 to transmit signals from the thin film transistor to the pixel electrode 32. Specifically, the active part 31 includes a channel. The source 41 and the drain 42 are respectively connected to the opposite ends of the channel, and the channel is disposed on a side of the gate 21 away from the substrate 10.

It should be noted that although the active part 31 is connected to the pixel electrode 32, a part between the channel of the active part 31 and the pixel electrode 32 is not directly conductive in the embodiments of the present disclosure to avoid the direct conduction between the pixel electrode 32 and the channel. This avoids the direct conductive treatment to the part between the channel of the active part 31 and the pixel electrode 32, which may affect the channel, and the difficulty of the process and the demand for process accuracy are reduced. Therefore, in the embodiments of the present disclosure, the source 41 and the drain 42 are formed in other film layers and are connected to both ends of the channel of the active part 31, which may achieve control signal on/off and ensure the yield of the active part 31.

In an embodiment, the active part 31 is an oxide semiconductor, and the pixel electrode 32 is an oxide conductor. Specifically, the material of the active part 31 includes indium gallium zinc oxide, and the pixel electrode 32 may be an oxide conductor formed by conductive treatment of indium gallium zinc oxide. After the conductive treatment, the pixel electrode 32 may reduce its resistance and improve its transmittance.

It can be understood that in the embodiment of the present disclosure, the pixel electrode 32 and the active part 31 are prepared in a same process, which may save one mask process, simplify the process, and reduce costs.

In an embodiment, the inorganic insulation layer 63 may be a stacked structure of multiple sublayers, and the inorganic insulation layer 63 includes an oxide sublayer close to the substrate 10. The oxide sublayer is in contact with the active part 31, and the active part 31 may be oxygenated to repair internal oxygen vacancies and improve the stability of the thin film transistor. A material of the oxide sublayer may include silicon oxide, and materials of other sublayers of the inorganic insulation layer 63 may include silicon oxide and/or silicon nitride.

In an embodiment, the source 41 is connected to the active part 31, and the drain 42 is connected between the active part 31 and the pixel electrode 32. Specifically, the drain 42 is disposed on a surface of the active part 31 away from the gate 21 and extends to a surface of the pixel electrode 32 away from the substrate 10 to achieve electrical connection between the active part 31 and the pixel electrode 32.

It should be noted that the display panel provided by the embodiments of the present disclosure may be a liquid crystal display panel. The display panel further includes a color film substrate (not shown in the figures) disposed on a side of the array layer away from the substrate 10, and a liquid crystal layer disposed between the array layer and the color film substrate. An electric field may be formed between the common electrode 51 and the pixel electrode 32 to drive the deflection of liquid crystal molecules in the liquid crystal layer.

In an embodiment, the common electrode 51 is disposed on the inorganic insulation layer 63. A plurality of openings are defined in an area of the common electrode 51 corresponding to the pixel electrode 32 to expose the pixel electrode 32. The common electrode 51 may cover areas other than the openings, thereby forming a horizontal electric field between the pixel electrode 32 and the common electrode 51.

An orthographic projection of the source 41 on the substrate 10 and an orthographic projection of the data line 44 on the substrate 10 both overlap an orthographic projection of the common electrode 51 on the substrate 10. Moreover, since the organic insulation layer 62 covers the data line 44 and the source 41, the organic insulation layer 62 is disposed between the common electrode 51 and the data line 44, and between the common electrode 51 and the source 41. The organic insulation layer 62 may increase a distance between the common electrode 51 and the data line 44, and a distance between the common electrode 51 and the source 41, thereby reducing a parasitic capacitance generated between the common electrode 51 and the data line 44, and a parasitic capacitance generated between the common electrode 51 and the source 41.

In an embodiment, a color of the organic insulation layer 62 is black. For example, black photoresist may be used to prepare the organic insulation layer 62, which may effectively reduce the reflection of light by the third device layer 40, thereby improving the contrast and display effect of the display panel.

Furthermore, an orthographic projection of the organic insulation layer 62 on the substrate 10 is in an orthographic projection of the source 41 and the data line 44 on the substrate 10. Therefore, the organic insulation layer 62 can be aligned or inward contracted on both sides of the source 41 and the data line 44, and will not form an eaves structure on both sides of the source 41 and the data line 44. As the inorganic insulation layer 63 is deposited on the side of the organic insulation layer 62 away from the substrate 10, the membrane continuity of the inorganic insulation layer 63 on both sides of the source 41 and data line 44 can be improved, avoiding the occurrence of fracture and discontinuity of the inorganic insulation layer 63 during the deposition process due to the generation of eaves structure.

Figure 4:
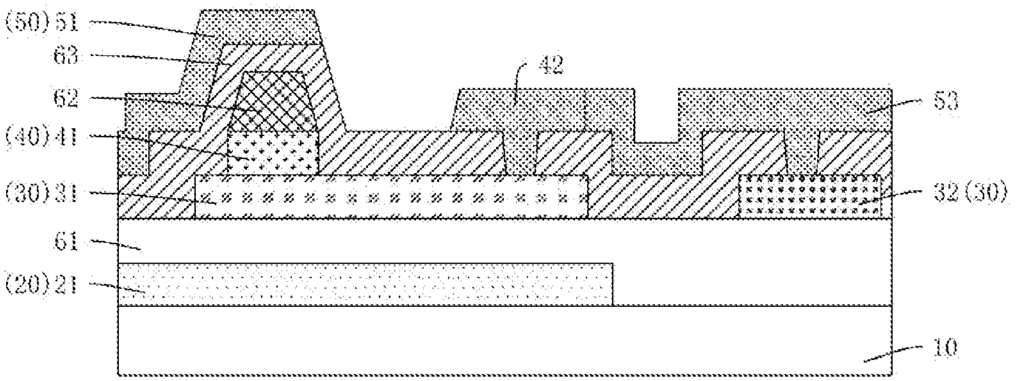
FIG. 4 is a second cross-sectional schematic view of the display panel corresponding to the active part provided by an embodiment of the present disclosure.

In another embodiment of the present disclosure, referring to FIG. 4, the difference between this embodiment and the embodiment shown in FIG. 1 is that the fourth device layer 50 includes the drain 42 and a connection electrode 53, that is, the drain 42 is disposed in the fourth device layer 50 and not in the third device layer 40.

One end of the connection electrode 53 is connected to the drain 42, and other end of the connection electrode 53 is connected to the pixel electrode 32 by passing through a via hole of the inorganic insulation layer 63. One end of the drain 42 is connected to the active part 31 by passing through a via hole of the inorganic insulation layer 63, and other end of the drain 42 is connected to the connection electrode 53.

In the embodiment, the connection electrode 53 is electrically insulated from the common electrode 51, that is, the connection electrode 53 is spaced apart from the common electrode 51, and the active part 31 is spaced apart from the pixel electrode 32.

Furthermore, the connection electrode 53 may be integrally formed with the drain 42, or the connection electrode 53 and the drain 42 may be prepared in two separate processes, respectively.

Figure 5:
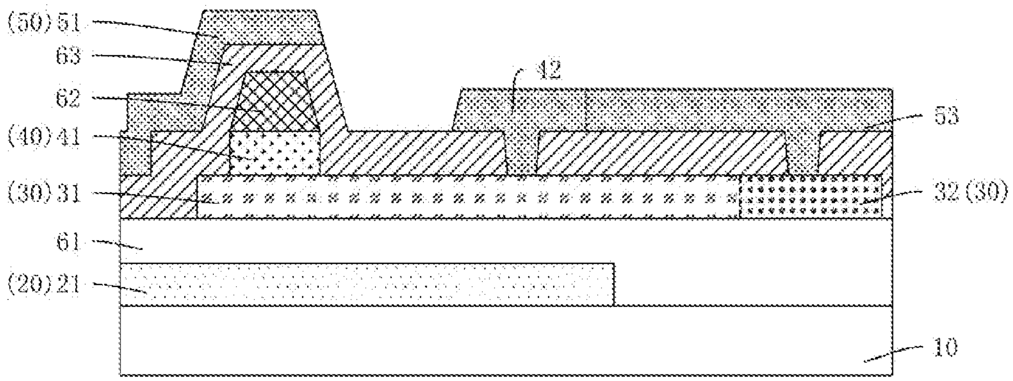
FIG. 5 is a third cross-sectional schematic view of the display panel corresponding to the active part provided by an embodiment of the present disclosure.

In another embodiment of the present disclosure, referring to FIG. 5, the difference between this embodiment and the embodiment shown in FIG. 4 is that the active part 31 is connected to the pixel electrode 32.

It can be understood that in the embodiment, the part between the connection between the active part 31 and the drain 42 and the pixel electrode 32 is a semiconductor, and has not been conductive. In addition, the channel of the active part 31 is connected to the pixel electrode 32 through the drain 42, to avoid the channel being conductive due to limitations such as process accuracy during the conductive processing of the part between the connection between the active part 31 and the drain 42 and the pixel electrode 32, Furthermore, the yield of the active part 31 can be improved.

Figure 6:
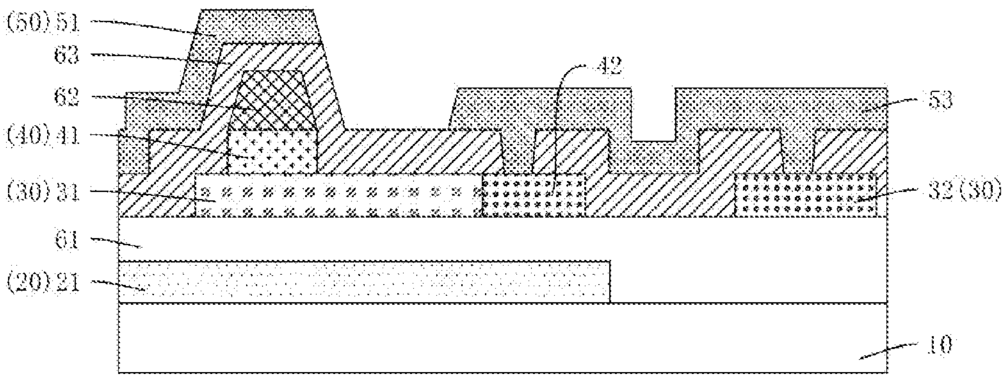
FIG. 6 is fourth cross-sectional schematic view of the display panel corresponding to an active part provided by an embodiment of the present disclosure.
Figure 7:
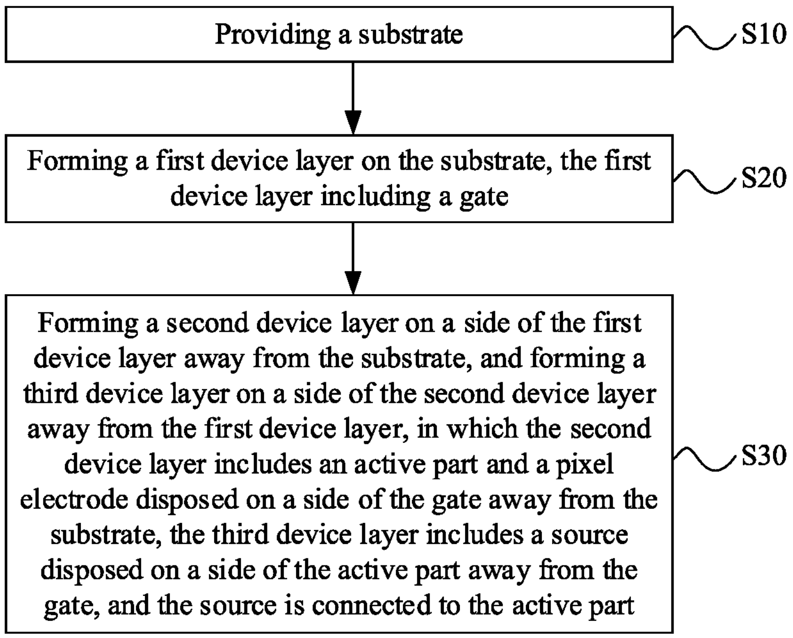
FIG. 7 is a flowchart of a manufacturing method of the display panel provided by an embodiment of the present disclosure.

In another embodiment of the present disclosure, referring to FIG. 6, the difference between this embodiment and the embodiment shown in FIG. 4 is that the fourth device layer 50 includes the connection electrode 53, the second device layer 30 includes a drain 42 connected to the active part 31. One end of the connection electrode 53 is connected to the drain 42 by passing through a via hole of the inorganic insulation layer 63. Other end of the electrode 53 is connected to the pixel electrode 32 by passing through another via hole of the inorganic insulation layer 63.

The drain 42 may be a conductor obtained by conducting semiconductor materials.

Furthermore, in the embodiment of the present disclosure, the pixel electrode 32 and the active part 31 are formed in the same film layer, which may reduce the number of photomasks, simplify the process, and thus reduce production costs.

In addition, the embodiments of the present disclosure further provide a manufacturing method of the display panel. Referring to FIGS. 1, 2, 3, 7, and 8 to 25, the manufacturing method of the display panel includes the following steps S10 to S30.

At step S10, the substrate of 10 is provided.

At step S20, the first device layer 20 is formed on the substrate 10. The first device layer 20 includes the gate 21.

At step S30, the second device layer 30 is formed on the side of the first device layer 20 away from the substrate 10, and the third device layer 40 is formed on the side of the second device layer 30 away from the first device layer 20. The second device layer 30 includes the active part 31 and the pixel electrodes 32 disposed on the side of the gate 21 away from the substrate 10. The third device layer 40 includes the source 41 disposed on the side of the active part 31 away from the gate 21, and the source 41 is connected to the active part 31.

Furthermore, the manufacturing method of the display panel further includes: forming the drain 42. The drain 42 is electrically connected to the pixel electrode 32 and the active part 31.

Specifically, in an embodiment of the present disclosure, continuing to refer to FIGS. 1, 2, 3, 7, and 8 to 25, in step S10, the substrate 1 is not limited to a rigid substrate or a flexible substrate, such as a glass substrate or an organic resin substrate.

In step S20, a first conductive material layer is formed on the substrate 10. In an embodiment, the first conductive material layer may be made of a conductive metal material.

Then, the first conductive material layer is etched to obtain a patterned structure, resulting in the first device layer 20. The gate 21 and a first signal line 22 are formed in the first device layer 20.

Figure 8:
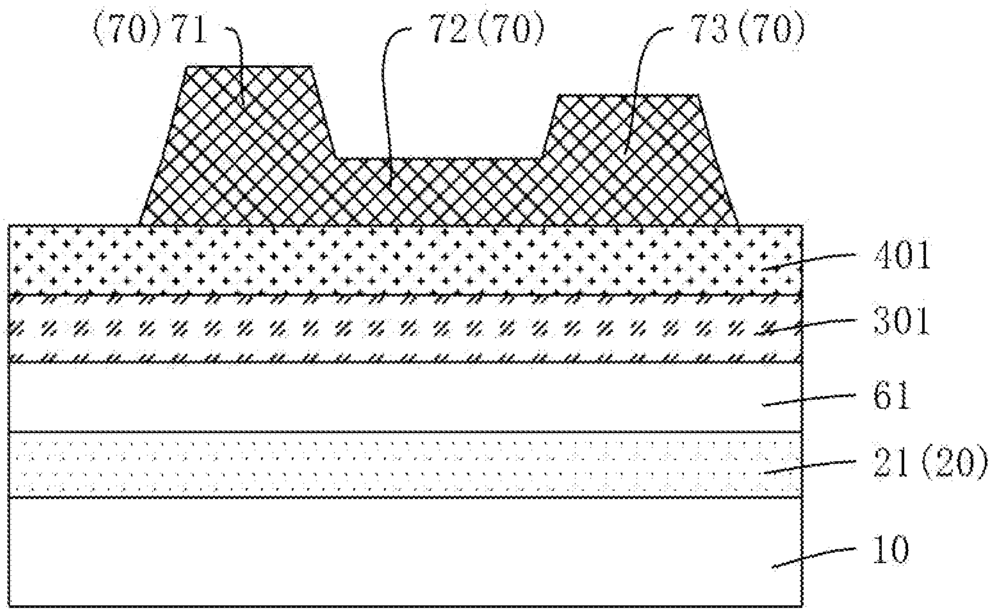
FIGS. 8 to 25 are schematic view during a manufacturing process of the display panel provided by some embodiments of the present disclosure.

Referring to FIG. 8, in step S30, the gate insulation layer 61, a semiconductor material layer 301, and the second conductive material layer 401 are sequentially deposited on the side of the first device layer 20 away from the substrate 10.

In an embodiment, the material of the gate insulation layer 61 includes at least one of silicon oxide and silicon nitride. The semiconductor material layer 301 may include an oxide semiconductor, such as indium gallium zinc oxide. The material of the second conductive material layer 401 may include a conductive metal.

In the embodiment of the present disclosure, a multi-tone mask may be used to pattern the semiconductor material layer 301 and the second conductive material layer 401 to form the second device layer 30 and the third device layer 40.

Figure 9:
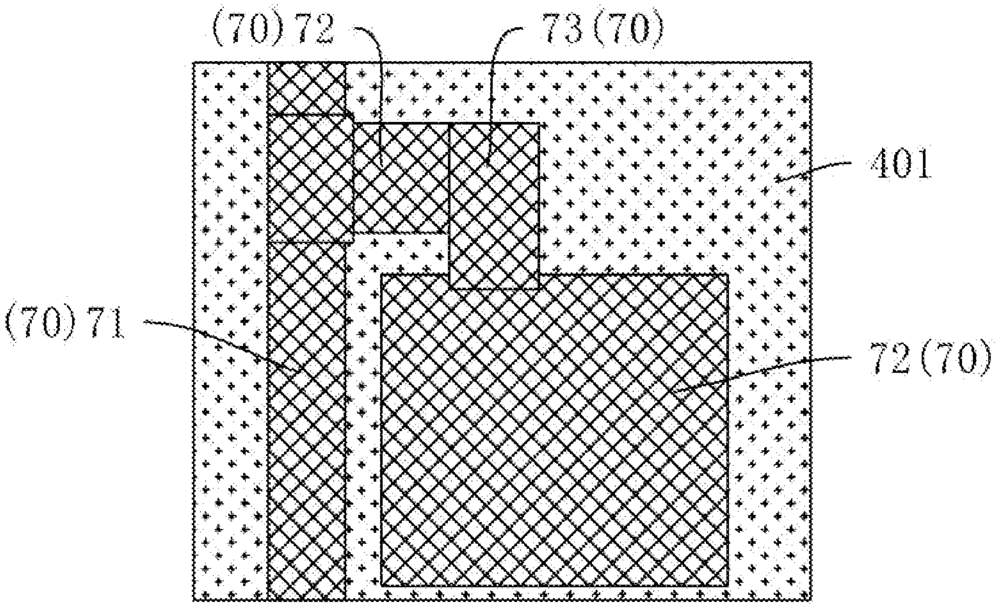

As shown in FIGS. 8 and 9, specifically, a photoresist layer 70 is formed on the side of the second conductive material layer 401 away from the substrate 10, and the photoresist layer 70 is patterned using the multi-tone mask to form a first photoresist part 71, a second photoresist part 72, and a third photoresist part 73 disposed on the side of the second conductive material layer 401 away from the substrate 10. A thickness of the first photoresist part 71 is greater than that of the third photoresist part 73. The thickness of the third photoresist part 73 is greater than that of the second photoresist part 72.

In an embodiment, a material of the photoresist layer 70 includes a positive photoresist. In the multi-tone mask, a transmittance at a position corresponding to the second photoresist part 72 is greater than that at a position corresponding to the third photoresist part 73. The position corresponding to the second photoresist part 72 is a semi-transparent area. The position corresponding to the first photoresist part 71 is opaque. Other areas of the multi-tone mask not covering the photoresist layer 70 is fully transparent to remove the positive photoresist material corresponding to the other areas.

It should be noted that the first photoresist part 71 may cover an area used to form the source 41 and the data line 44. The second photoresist part 72 may cover an area used to form the active part 31 and the pixel electrode 32. The third photoresist part 73 may cover an area used to form the drain 42.

Figure 10:
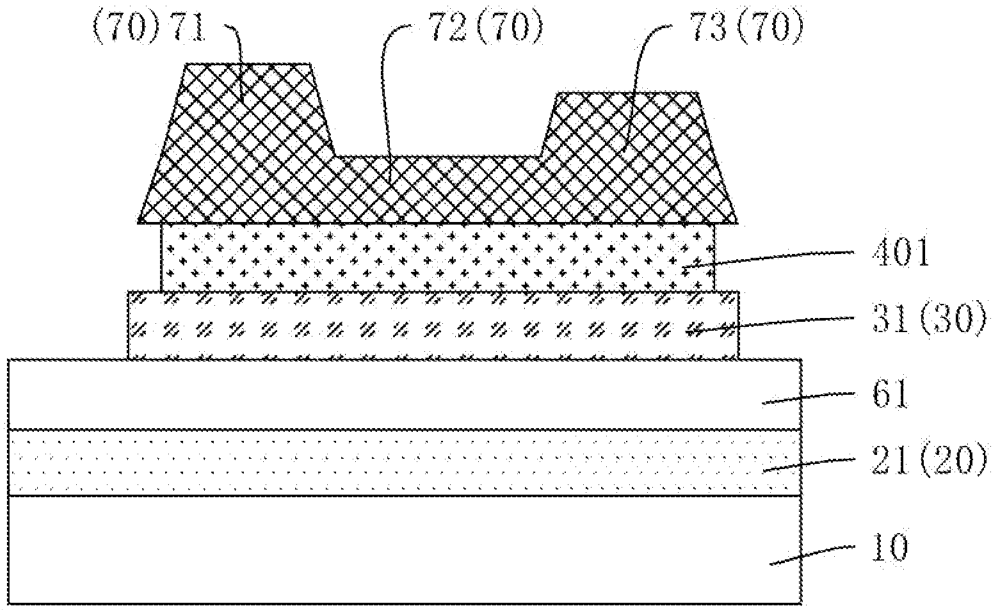
Figure 11:
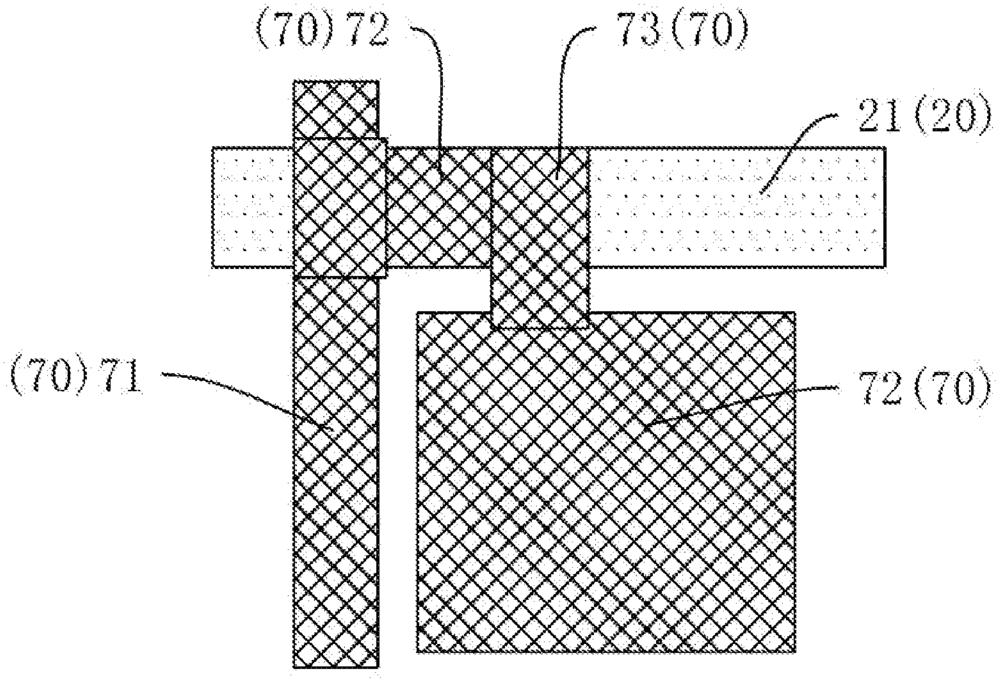

As shown in FIGS. 10 and 11, the second conductive material layer 401 and the semiconductor material layer 301 are patterned by a photoresist layer 70 as a mask to remove a part of the second conductive material layer 401 and the semiconductor material layer 301 beyond the coverage range of the photoresist layer 70.

Figure 12:
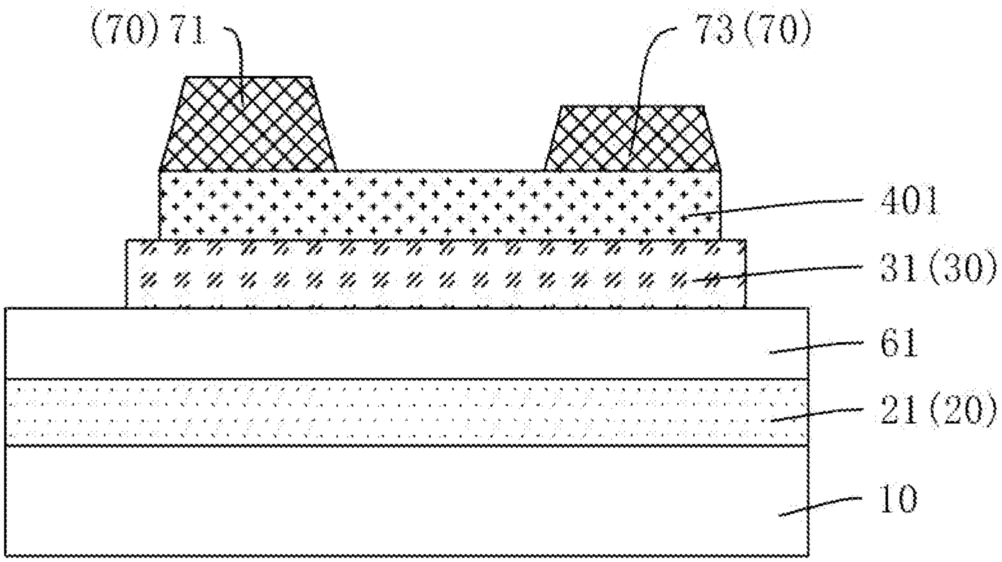
Figure 13:
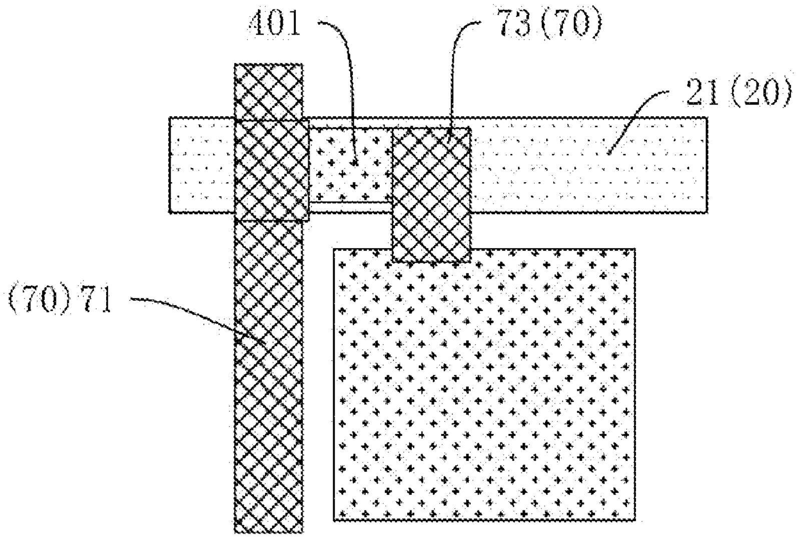

As shown in FIGS. 12 and 13, next, the second photoresist part 72 is removed to expose a part of the upper surface of the second conductive material layer 401.

In an embodiment, the second photoresist part 72 may be removed by an $O_2$ ashing process, while a part of the first photoresist part 71 and a part of the third photoresist part 73 are simultaneously removed.

Figure 15:
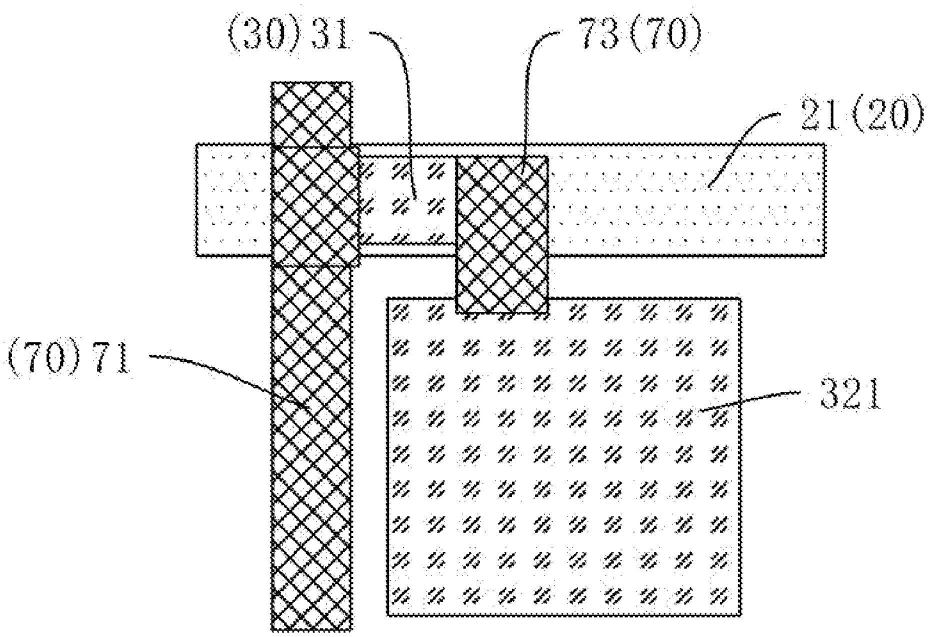

As shown in FIG. 15, then, using the remaining first photoresist part 71 and the third photoresist part 73 as a mask, patterning processing is performed on the second conductive material layer 401. Therefore, the active part 31 and the intermediate electrode part 321 are formed by the patterning of the semiconductor material layer 301, and the source 41 and the drain 42 are formed by the patterning of the second conductive material layer 401. It should be noted that, the active part 31 and the intermediate electrode part 321 may be patterned in the step shown in FIGS. 12 and 13.

In an embodiment, the second conductive material layer 401 includes a conductive metal material, and Cu acid may be used to etch the second conductive material layer 401.

Figure 14:
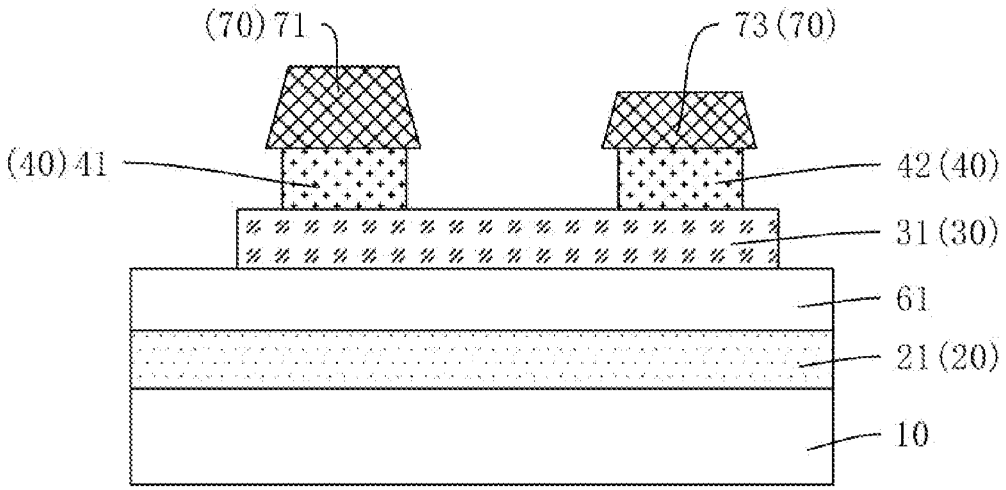

As shown in FIGS. 14 and 15, the source 41 and the drain 42 are disposed on the side of the active part 31 away from the gate 21, and are respectively connected to the opposite ends of the active part 31. The intermediate electrode part 321 is connected to the active part 31, and the drain 42 is disposed on the surface of the active part 31 away from the gate 21 and extends to the surface of the intermediate electrode part 321 away from the substrate 10.

It should be pointed out that the gate 21, the active part 31, the source 41, and the drain 42 form the thin film transistor. In the step shown in FIG. 11, the first photoresist part 71 forms an eaves structure on both sides of the source 41 and the data line 44.

Figure 16:
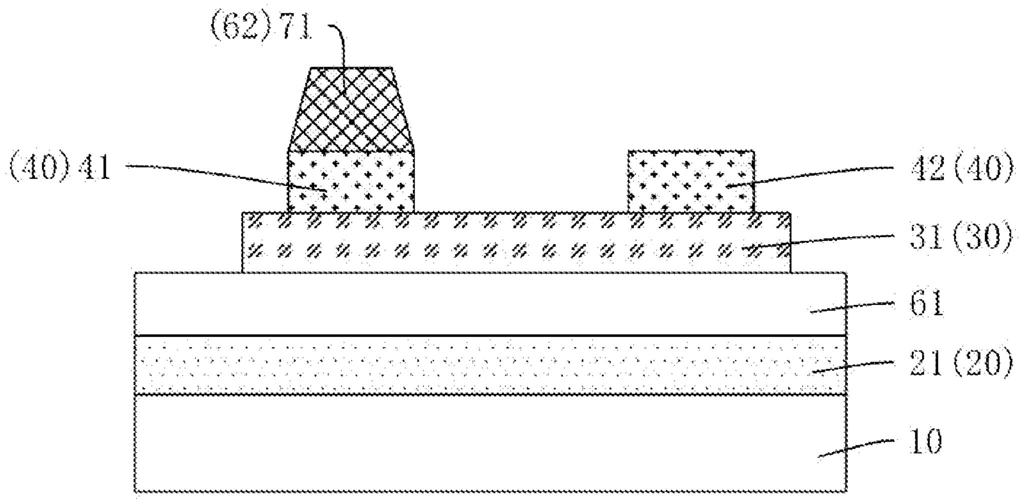
Figure 17:
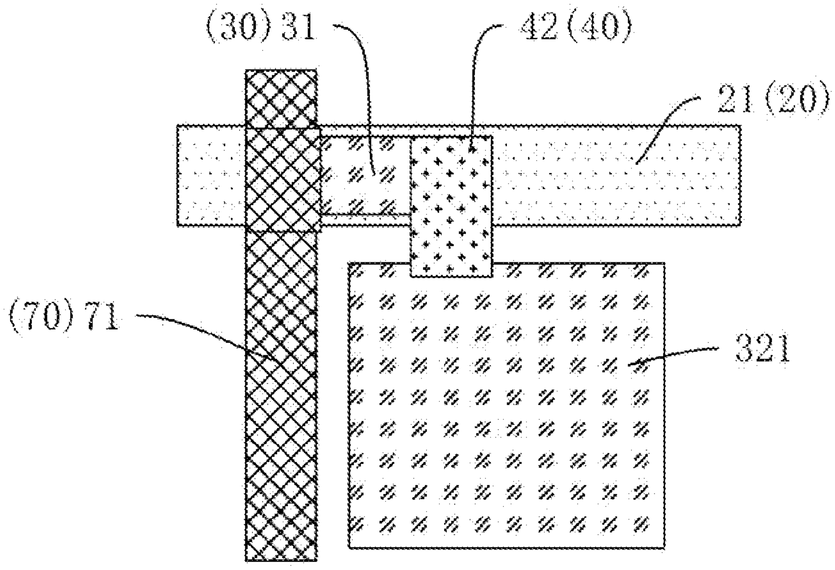

As shown in FIGS. 16 and 17, then the third photoresist part 73 and a part of the first photoresist part 71 are removed to expose the drain 42. and the remaining part of the first photoresist part 71 forms an organic insulation layer 62. A part of the first photoresist part 71 is removed so that the orthographic projection of the organic insulation layer 62 on the substrate 10 is in the orthographic projection of the source 41 and the data line 44 on the substrate 10. That is, the eaves structure formed by the first photoresist part 71 on both sides of the source 41 and the data line 44 is removed.

In an embodiment, the ashing process may be used to remove the first photoresist part 71 and a part of the first photoresist part 71.

In an embodiment, the photoresist layer 70 is a black photoresist. Therefore, when the organic insulation layer 62 covers the surface of the source 41 and the data line 44, the reflection of light by the third device layer 40 can be reduced, which can effectively improve the contrast and display effect of the display panel.

Figure 18:
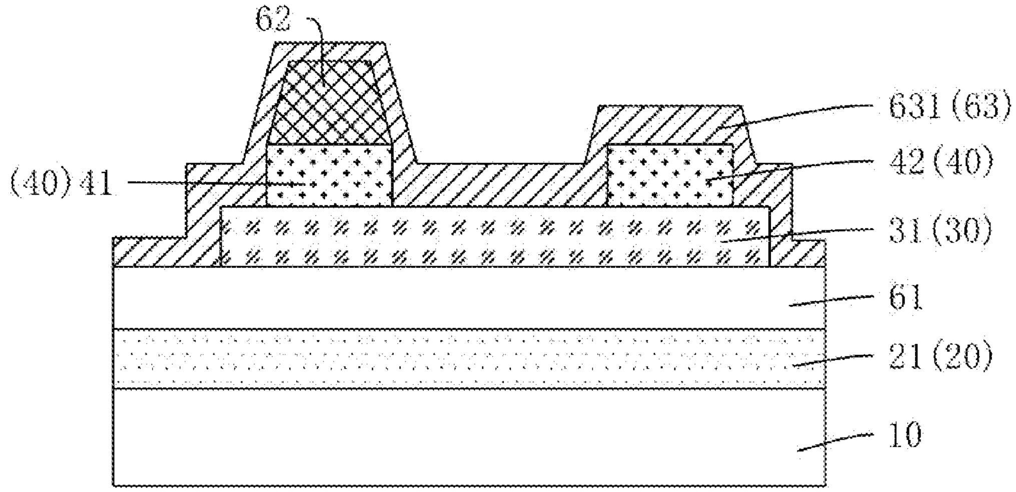

As shown in FIG. 18, the oxide sublayer 631 is formed and the oxide sublayer 631 covers the organic insulation layer 62, the drain 42, the active part 31, and the oxide sublayer 631 of the gate insulation layer 61. The oxide sublayer 631 is in contact with the surface of the active part 31 away from the gate 21, which may then supplement oxygen to the active part 31, repair internal oxygen vacancies, and improve the stability of the thin film transistor. The material of oxide sublayer 631 may include silicon oxide.

It should be noted that due to the adjustment of the structure of the organic insulation layer 62 in the embodiment of the present disclosure, the eaves structure of the first photoresist part 71 on both sides of the source 41 and the data line 44 is removed, so that the oxide sublayer 631 can better cover the sides of the source 41 and data line 44, reducing the probability of fracture and discontinuity of the oxide sublayer 631 on the sides of the source 41 and the data line 44.

Figure 19:
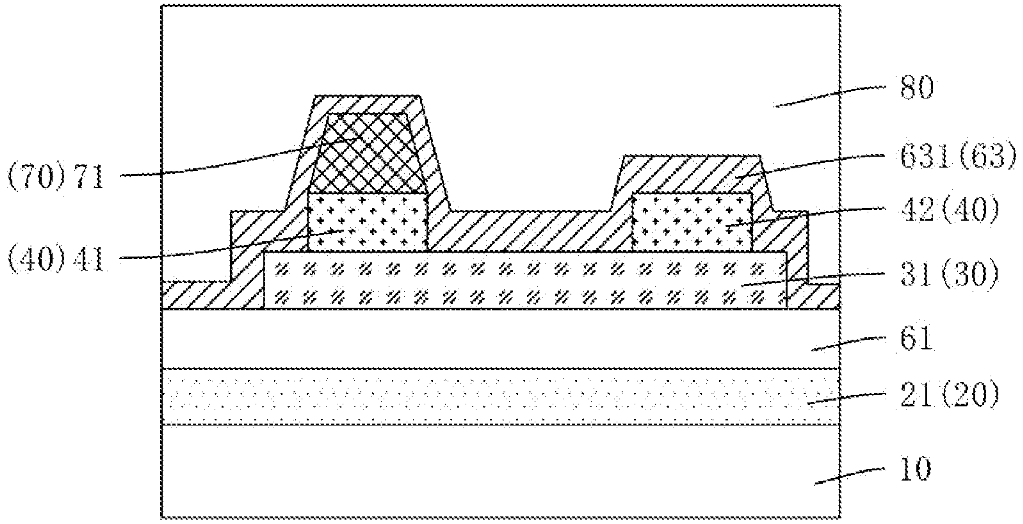
Figure 20:
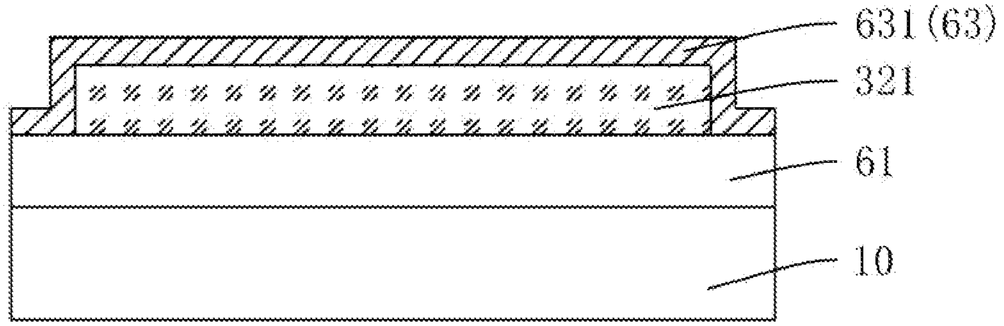

As shown in FIGS. 19 and 20, then, a protective layer 80 is formed in an area corresponding to the thin film transistor. An orthographic projection of the thin film transistor on the substrate 10 may be in an orthographic projection of the protective layer 80 on the substrate 10, while other parts of the display panel are not provided with the protective layer 80. For example, an area corresponding to the intermediate electrode part 321 is not provided with the protective layer 80.

In an embodiment, a material of the protective layer 80 may include photoresist.

Figure 21:
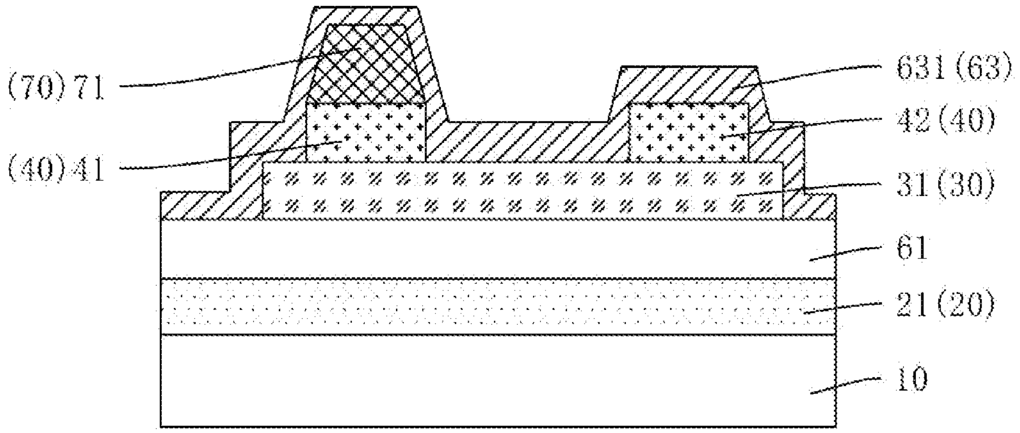
Figure 22:
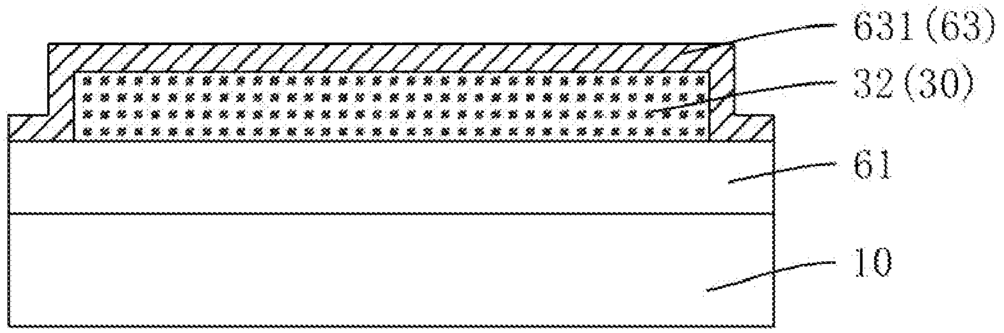

As shown in FIGS. 21 and 22, the display panel is then processed by plasma. As the intermediate electrode part 321 is not covered by the protective layer 80, while the active part 31 is covered by the protective layer 80, the intermediate electrode part 321 undergoes conductive processing to form the pixel electrode 32, while the active part 31 maintains semiconductor characteristics.

It should be noted that in the embodiment of the present disclosure, before conducting the conductive treatment on the intermediate electrode portion 321, the oxide sublayer 631 is first deposited, thereby avoiding the increase in resistance of the pixel electrode 32 caused by the deposition of oxide material after the conductive treatment, and improving the display effect of the display panel.

Figure 23:
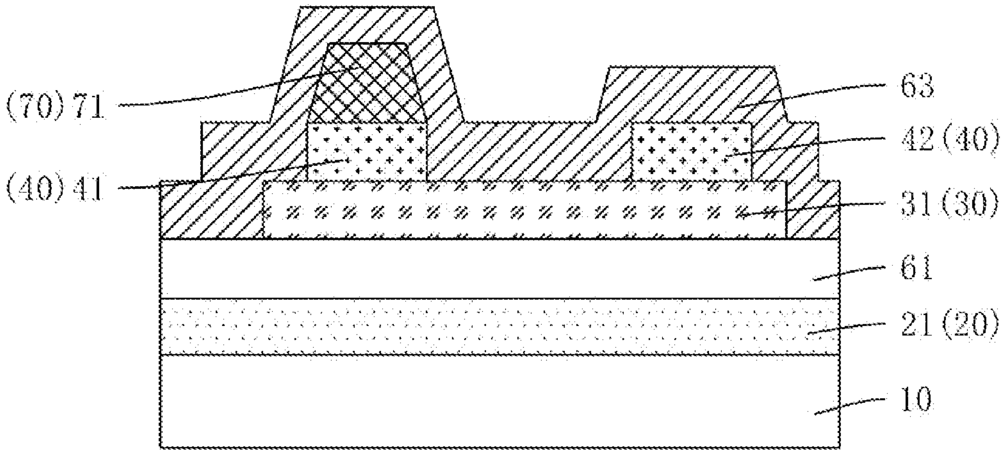
Figure 24:
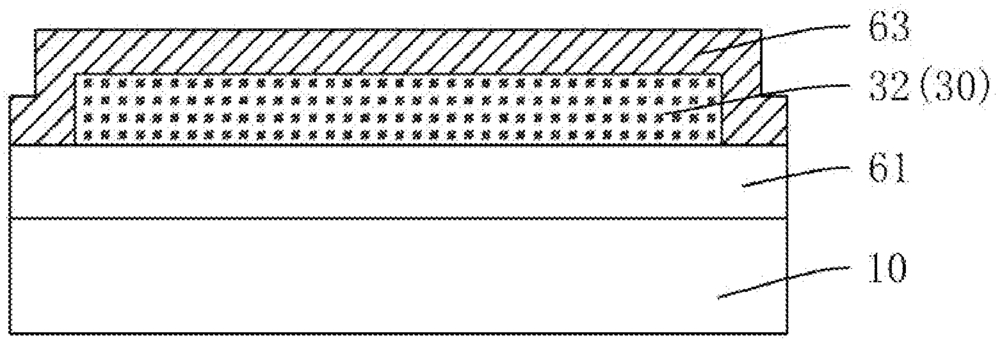

As shown in FIGS. 23 and 24, then, an insulation sublayer is deposited on a side of the oxide sublayer 631 away from the substrate 10 to obtain a stacked structure of multiple sublayers, that is, the inorganic insulation layer 63 is obtained to improve the protection effect of the inorganic insulation layer 63 on the active part 31. The material of the insulation layer may include silicon oxide and/or silicon nitride.

Figure 25:
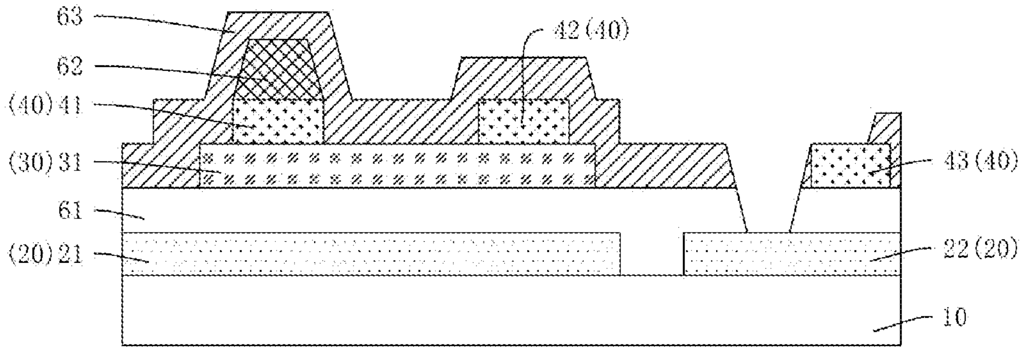

As shown in FIG. 25, the inorganic insulation layer 63 and the gate insulation layer 61 are patterned to define the openings corresponding to the first signal line 22 and the second signal line 43.

As shown in FIGS. 1 and 2, the third conductive material layer is formed on the side of the inorganic insulation layer 63 away from the substrate 10. The third conductive material layer is patterned to obtain the fourth device layer 50. The common electrode 51 and the adapter part 52 are formed in the fourth device layer 50. The common electrode 51 is disposed on the inorganic insulation layer 63, and the common electrode 51 define a plurality of openings in the area corresponding to the pixel electrode 32 to expose at least a part of the pixel electrode 32. The common electrode 51 may cover the area other than the openings, thereby forming a horizontal electric field between the pixel electrode 32 and the common electrode 51. One end of the adapter part 52 is connected to the second signal line 43, and the other end passes through the inorganic insulation layer 63 and the gate insulation layer 61 and is connected to the first signal line 22. The display panel includes a display area, a non-display area adjacent to the display area, and a driving circuit unit disposed in the non-display area. One end of the second signal line 43 is connected to the driving circuit unit, and the other end of the second signal line 43 is connected to the adapter part 52.

In an embodiment, the driving circuit unit is the GOA gate driving circuit unit, and the second signal line 43 may be used to transmit the scanning signal from the GOA gate driving circuit unit to the display area and transmit it to the gate 21 through the first signal line 22.

It should be noted that an orthographic projection of the source 41 on substrate 10 and an orthographic projection of the data line 44 on the substrate 10 both overlap the orthographic projection of the common electrode 51 on the substrate 10. Additionally, due to the organic insulation layer 62 covering the data line 44 and the source 41, the organic insulation layer 62 is disposed between the common electrode 51 and the data line 44, as well as between common electrode 51 and source 41. Furthermore, the organic insulation layer 62 can increase the distance between the common electrode 51 and the data line 44, as well as the distance between the common electrode 51 and the source 41, thereby reducing the parasitic capacitance generated between the common electrode 51 and the data line 44, as well as the parasitic capacitance generated between the common electrode 51 and the source 41.

In the manufacturing method of the display panel provided in the embodiment of the present disclosure, the patterning of the first conductive material layer involves a first mask process. The patterning of the semiconductor material layer 301 and the second conductive material layer 401 involves a second mask process. The secondary patterning of the second conductive material layer 401 to form the source 41 and the drain 42 involves a third mask process. The patterning of the inorganic insulation layer 63 and the gate insulation layer 61 to define the openings involves a fourth mask process. The patterning of the third conductive material layer to obtain the fourth device layer 50 involves the fifth mask process. In the embodiment of the present disclosure, the array layer of the display panel is prepared by five mask processes, simplifying the process flow and reducing process costs.

In the embodiments of the present disclosure, the active part 31 and the pixel electrode 32 are prepared in the same film layer, which can save the number of photomasks. In additional, a multi-tone mask is used to pattern the semiconductor material layer 301 and the second conductive material layer 401, so that the remaining first photoresist part 71 may form the organic insulation layer 62. The organic insulation layer 62 is disposed between the source 41 and the common electrode 51, as well as between the data line 44 and the common electrode 51, to reduce the parasitic capacitance generated between the common electrode 51 and the data line 44, as well as the parasitic capacitance generated between the common electrode 51 and the source 41. Furthermore, the organic insulation layer 62 may be made of the black photoresist, which can reduce the reflection of light by the source 41 and the data line 44, thereby improving the contrast and display effect of the display panel.

In another embodiment of the present disclosure, referring to FIG. 4, the difference between this embodiment and the embodiment shown in FIG. 1 is that when patterning the second conductive material layer 401 to form the third device layer 40, the source 41 is formed on the side of the active part 31 away from the gate 21 without forming a drain 42. The third conductive material layer is patterned to form the common electrode 51 and the drain 42. The drain 42 is spaced apart from the common electrode 51. One end of the drain 42 passes through the inorganic insulation layer 63 and is connected to the active part 31, and the other end of the drain 42 passes through the inorganic insulation layer 63 and is connected to the pixel electrode 32.

In addition, in the embodiment, when patterning the semiconductor material layer 301, due to the lack of coverage of the drain 42, the connection part between the active part 31 and the pixel electrode 32 can be etched and removed, so that the active part 31 and the pixel electrode 32 are spaced apart.

In another embodiment of the present disclosure, referring to FIG. 5, the difference between this embodiment and the embodiment shown in FIG. 4 is that when patterning the semiconductor material layer 301, the connecting part between the active part 31 and the pixel electrode 32 is retained, so that the active part 31 and the pixel electrode 32 are connected.

In another embodiment of the present disclosure, referring to FIG. 6, the difference between this embodiment and the embodiment shown in FIG. 4 is that when patterning the semiconductor material layer 301, the conductive treatment is performed for a part of the semiconductor connected to the active part 31 to form the drain 42 connected to the source part 31. When patterning the third conductive material layer, the common electrode 51 and the connection electrode 53 are formed. One end of the connection electrode 53 passes through the inorganic insulation layer 63 and is connected to the drain 42, and the other end of the connection electrode 53 passes through the inorganic insulation layer 63 and is connected to the pixel electrode 32.

In addition, the embodiments of the present disclosure further provide a display device, which includes the display panel as described in the above embodiments. Therefore, the display device provided in the embodiments of the present disclosure has the same beneficial effect as the display panel as described in the above embodiments, and will not be further described here.

In the above embodiments, the description of each embodiment has its own emphasis. For parts that are not detailed in one embodiment, please refer to the relevant descriptions of other embodiments.

The display panel and the manufacturing method thereof provided in the embodiments of the present disclosure are described in detail above. The principle and implementations of the present disclosure are described in this specification by using specific examples. The description about the foregoing embodiments is merely provided to help understand the method and core ideas of the present disclosure. In addition, those skilled in the art can make modifications in terms of the specific implementations and application scopes according to the ideas of the present disclosure. Therefore, the content of this specification shall not be construed as a limit to the present disclosure.

What is claimed is:

1. A display panel, comprising:
- a substrate;
- a first device layer disposed on the substrate and comprising a gate;
- a second device layer disposed on a side of the first device layer away from the substrate, wherein the second device layer comprises an active part and a pixel electrode disposed on a side of the gate away from the substrate; and
- a third device layer disposed on a side of the second device layer away from the first device layer, wherein the third device layer comprises a source disposed on a side of the active part away from the gate, and the source is connected to the active part;
- wherein the display panel further comprises a drain, and the drain is electrically connected to the pixel electrode and the active part; and
- wherein the display panel further comprises a fourth device layer disposed on a side of the third device layer away from the second device layer, the fourth device layer comprises a common electrode and a connection electrode, the connection electrode is insulated from the common electrode, one end of the connection electrode is connected to the drain, and another end of the connection electrode is connected to the pixel electrode.

2. The display panel of claim 1, wherein the third device layer further comprises the drain, the pixel electrode is connected to the active part, and the drain is disposed on a surface of the active part away from the gate and extends to a surface of the pixel electrode away from the substrate.

3. The display panel of claim 1, wherein the second device layer further comprises the drain, and the drain is connected to the active part.

4. The display panel of claim 1, wherein the display panel further comprises an inorganic insulation layer disposed between the third device layer and the fourth device layer, and the connection electrode is connected to the drain and the pixel electrode respectively by passing through two via holes of the inorganic insulation layer.

5. The display panel of claim 4, wherein the inorganic insulation layer comprises an oxide sublayer, and the oxide sublayer is in contact with the active part.

6. The display panel of claim 5, wherein a material of the oxide sublayer comprises silicon oxide.

7. The display panel of claim 6, wherein the inorganic insulation layer further comprises other sublayer disposed on a side of the oxide sublayer away from the substrate, and a material of the other sublayer comprises silicon oxide and/or silicon nitride.

8. The display panel of claim 1, wherein the display panel further comprises an inorganic insulation layer disposed between the third device layer and the fourth device layer, the fourth device layer further comprises the drain, one end of the drain passes through a via hole of the inorganic insulation layer and is connected to the active part, and another end of the drain is connected to the connection electrode.

9. The display panel of claim 1, wherein a plurality of openings are defined in an area of the common electrode corresponding to the pixel electrode, and the openings expose the pixel electrode.

10. The display panel of claim 1, wherein the third device layer further comprises a data line connected to the source, and the display panel further comprises an organic insulation layer at least covering a surface of the source and the data line away from the substrate.

11. The display panel of claim 10, wherein an orthographic projection of the organic insulation layer on the substrate is located within an orthographic projection of the source and the data line on the substrate.

12. The display panel of claim 10, wherein an orthographic projection of the source on the substrate and an orthographic projection of the data line on the substrate both overlap an orthographic projection of the common electrode on the substrate, and the organic insulation layer is disposed between the common electrode and the data line, and between the common electrode and the source.

13. The display panel of claim 10, wherein a material of the organic insulation layer is black photoresist.

14. The display panel of claim 1, wherein the active part comprises an oxide semiconductor, and the pixel electrode comprises an oxide conductor.

15. A display panel, comprising:
- a substrate;
- a first device layer disposed on the substrate and comprising a gate;

a second device layer disposed on a side of the first device layer away from the substrate, wherein the second device layer comprises an active part and a pixel electrode disposed on a side of the gate away from the substrate; and a third device layer disposed on a side of the second device layer away from the first device layer, wherein the third device layer comprises a source disposed on a side of the active part away from the gate, and the source is connected to the active part;

wherein the display panel further comprises a drain, and the drain is electrically connected to the pixel electrode and the active part;

wherein the third device layer further comprises a data line connected to the source, and the display panel further comprises an organic insulation layer at least covering a surface of the source and the data line away from the substrate; and wherein an orthographic projection of the organic insulation layer on the substrate is located within an orthographic projection of the source and the data line on the substrate.

16. The display panel of claim 15, wherein the third device layer further comprises the drain, the pixel electrode is connected to the active part, and the drain is disposed on a surface of the active part away from the gate and extends to a surface of the pixel electrode away from the substrate.

17. The display panel of claim 15, wherein the second device layer further comprises the drain, and the drain is connected to the active part.

18. The display panel of claim 15, wherein an orthographic projection of the source on the substrate and an orthographic projection of the data line on the substrate both overlap an orthographic projection of the common electrode on the substrate, and the organic insulation layer is disposed between the common electrode and the data line, and between the common electrode and the source.

19. The display panel of claim 15, wherein a material of the organic insulation layer is black photoresist.

20. The display panel of claim 15, wherein the active part comprises an oxide semiconductor, and the pixel electrode comprises an oxide conductor.

* * * * *